US012796354B2

(12) United States Patent
Lee et al.

(10) Patent No.: US 12,796,354 B2
(45) Date of Patent: Nov. 10, 2026

(54) SPIN COATER AND METHOD OF MANUFACTURING SEMICONDUCTOR DEVICE BY USING THE SAME

(71) Applicant: SAMSUNG ELECTRONICS CO., LTD., Suwon-si (KR)

(72) Inventors: Moosong Lee, Suwon-si (KR); Sangho Yun, Suwon-si (KR); Hyoungkook Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 462 days.

(21) Appl. No.: 18/237,712

(22) Filed: Aug. 24, 2023

(65) Prior Publication Data

US 2024/0071751 A1 Feb. 29, 2024

(30) Foreign Application Priority Data

Aug. 24, 2022 (KR) ........................ 10-2022-0106344

(51) Int. Cl.

*H10P 14/60* (2026.01)
*H10P 14/40* (2026.01)
*H10P 72/00* (2026.01)
*G03F 7/16* (2006.01)

(52) U.S. Cl.

CPC .......... *H10P 14/6342* (2026.01); *H10P 14/40* (2026.01); *H10P 72/0448* (2026.01); *H10P 72/0604* (2026.01); *G03F 7/162* (2013.01)

(58) Field of Classification Search

None

See application file for complete search history.

(56) References Cited

U.S. PATENT DOCUMENTS 6,019,844 A 2/2000 Chiu
7,138,014 B2 11/2006 Stevens et al.
8,282,999 B2 10/2012 Sinha et al.
8,677,933 B2 * 3/2014 Sato ........................ B05D 1/005 118/712
9,349,622 B2 5/2016 Wang et al.
9,984,891 B2 5/2018 Ogihara et al.
2004/0250839 A1 12/2004 Robertson et al.
2022/0157603 A1 5/2022 Ishiguro

FOREIGN PATENT DOCUMENTS

KR 10-2009-0042428 A 4/2009
KR 10-2021-0133458 A 1/2026

OTHER PUBLICATIONS

Office Action dated Jan. 15, 2026, issued by Korean Patent Office in Korean Patent Application No. 10-2022-0106344.

* cited by examiner

*Primary Examiner* — Michael P. Rodriguez
(74) *Attorney, Agent, or Firm* — Sughrue Mion, PLLC

(57) ABSTRACT

A method of manufacturing a semiconductor device. The method includes providing a viscous solution to a wafer, spinning the wafer to coat at least a portion of the wafer with the viscous solution, and treating the wafer coated with the viscous solution, by using an acoustic wave, wherein a frequency of the acoustic wave and an eigenfrequency of the wafer coated with the viscous solution are same.

8 Claims, 23 Drawing Sheets

SPIN COATER AND METHOD OF MANUFACTURING SEMICONDUCTOR DEVICE BY USING THE SAME

CROSS-REFERENCE TO RELATED APPLICATION

This application claims priority to Korean Patent Application No. 10-2022-0106344, filed on Aug. 24, 2022, in the Korean Intellectual Property Office, the disclosure of which is incorporated by reference herein in its entirety.

BACKGROUND

The disclosure relates to a spin coater and a method of manufacturing a semiconductor device by using the same.

To manufacture semiconductor devices, various processes, such as oxidation, photolithography, etching, thin-film deposition, metallization, electrical die sorting (EDS), and packaging processes, are performed on a wafer. As semiconductor devices are further miniaturized, the necessity for precise control of a semiconductor process gradually increases, and in the semiconductor process, the significance of a lithography process of drawing a circuit pattern on a wafer and an etching process using the circuit pattern has emerged.

When a layer to be etched is thick, a hardmask is additionally provided between a photoresist and the layer to be etched. The hardmask includes amorphous carbon formed by chemical vapor deposition (CVD) and a spin-on hardmask (SOH) formed by spin coating.

SUMMARY

One or more example embodiments provide a semiconductor device manufacturing method with improved reliability.

According to an aspect of an example embodiment, a method of manufacturing a semiconductor device includes: providing a viscous solution to a wafer; spinning the wafer to coat at least a portion of the wafer with the viscous solution; and treating the wafer coated with the viscous solution, by using an acoustic wave, wherein a frequency of the acoustic wave is the same as an eigenfrequency of the wafer coated with the viscous solution.

According to an aspect of an example embodiment, a method of manufacturing a semiconductor device includes: providing a viscous solution to a wafer; spinning the wafer to coat at least a portion of the wafer with the viscous solution; removing an edge bead from an edge of the wafer; and forming a circular first node having a first radius on the wafer by applying a first acoustic wave of a first eigenfrequency to the wafer coated with the viscous solution.

According to an aspect of an example embodiment, a method of manufacturing a semiconductor device includes: applying a first acoustic wave to a wafer spin-coated with a viscous solution so that a normal wave of a first node is formed on the wafer; and applying a second acoustic wave having a frequency that is different from that of the first acoustic wave so that a normal wave of a second node that is different from the normal wave of the first node is formed on the wafer.

According to an aspect of an example embodiment, a spin coater includes: a rotary driver configured to spin a wafer; a first dispenser configured to provide a viscous solution onto the wafer; and an acoustic wave generator configured to apply an acoustic wave to a viscous material formed on the wafer as the viscous solution is coated on at least a portion of the wafer by spinning the wafer, wherein a frequency of the acoustic wave is the same as a wafer eigenfrequency, at which the wafer coated with the viscous solution resonates.

According to an aspect of an example embodiment, a semiconductor structure includes: a wafer; and a viscous material coating at least a portion of a surface of the wafer, wherein the wafer is treated by an acoustic wave, and a frequency of the acoustic wave is the same as an eigenfrequency of the wafer, at which the wafer coated with the viscous material resonates.

BRIEF DESCRIPTION OF DRAWINGS

The above and other aspects and features will be more apparent from the following description of example embodiments, taken in conjunction with the accompanying drawings in which.

DETAILED DESCRIPTION OF THE EMBODIMENTS

Figure 1:
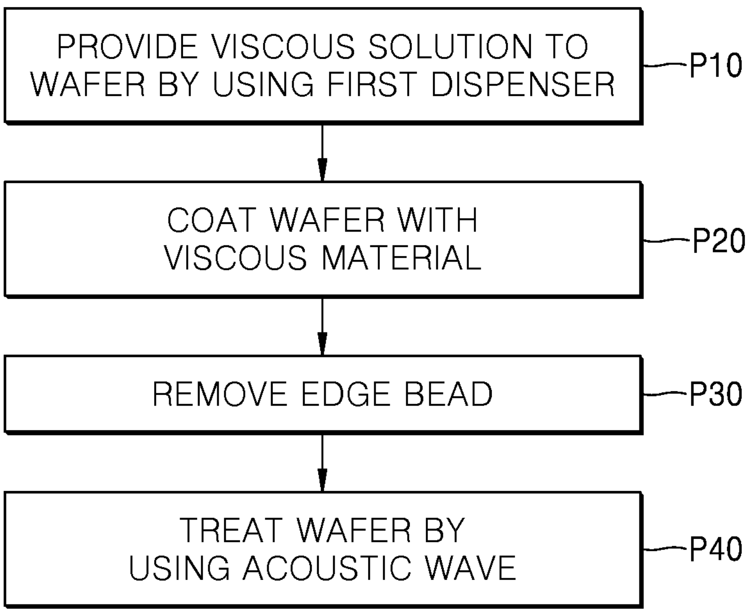
FIG. 1 is a flowchart for describing a method of manufacturing a semiconductor device, according to embodiments.

Example embodiments will be described more fully with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Like reference numerals in the drawings denote like elements, and thus their repetitive description is omitted. In the drawings, in some instances, the thicknesses or sizes of layers may be exaggerated for convenience and clarity of description. In an example embodiment, the layers have the shapes and ratios as shown and illustrated in the various drawings, but the example embodiments are not limited thereto and other example embodiments may include somewhat different shapes and ratios from those show in the drawings.

FIG. 1 is a flowchart for describing a method of manufacturing a semiconductor device, according to embodiments.

FIGS. 2A to 2D are schematic front views for describing a spin coater 100 used to perform a semiconductor device manufacturing method, according to embodiments.

Figure 2A:
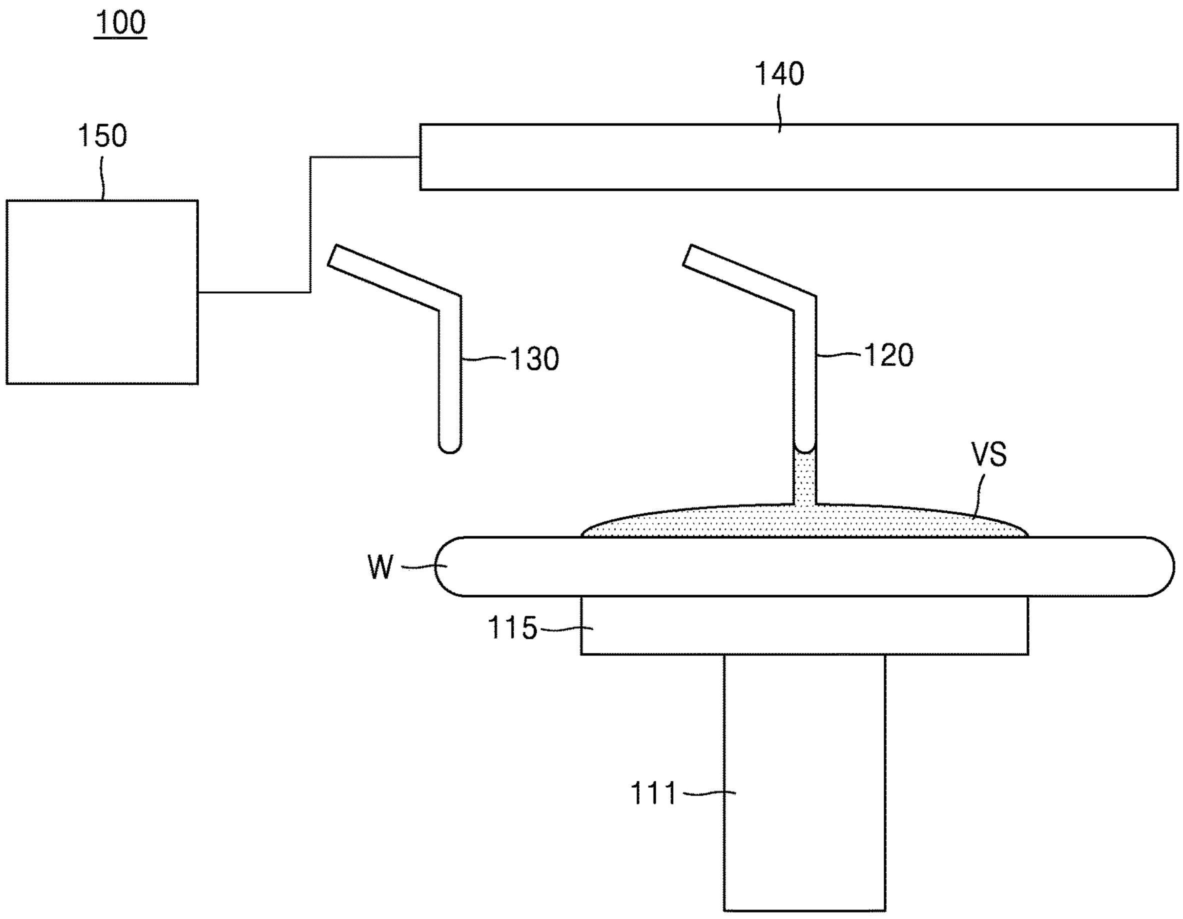
FIGS. 2A to 2D are schematic front views for describing a spin coater used to perform a semiconductor device manufacturing method, according to embodiments.

Referring to FIGS. 1 and 2A, in operation P10, a viscous solution VS may be provided to a wafer W.

The viscous solution VS may be provided by a first dispenser 120 of the spin coater 100. The viscous solution VS may include a solution of, for example, a spin-on hardmask (SOH) or a spin-on dielectric (SOD).

The spin coater 100 may include, in addition to the first dispenser 120 described above, a rotary driver 111, a chuck 115, a second dispenser 130, an acoustic wave generator 140, and a controller 150.

The wafer W may be mounted on the chuck 115. The chuck 115 may be a vacuum chuck fixing the wafer W by vacuum pressure but is not limited thereto. For example, the chuck 115 may be an electrostatic chuck.

Figure 2B:
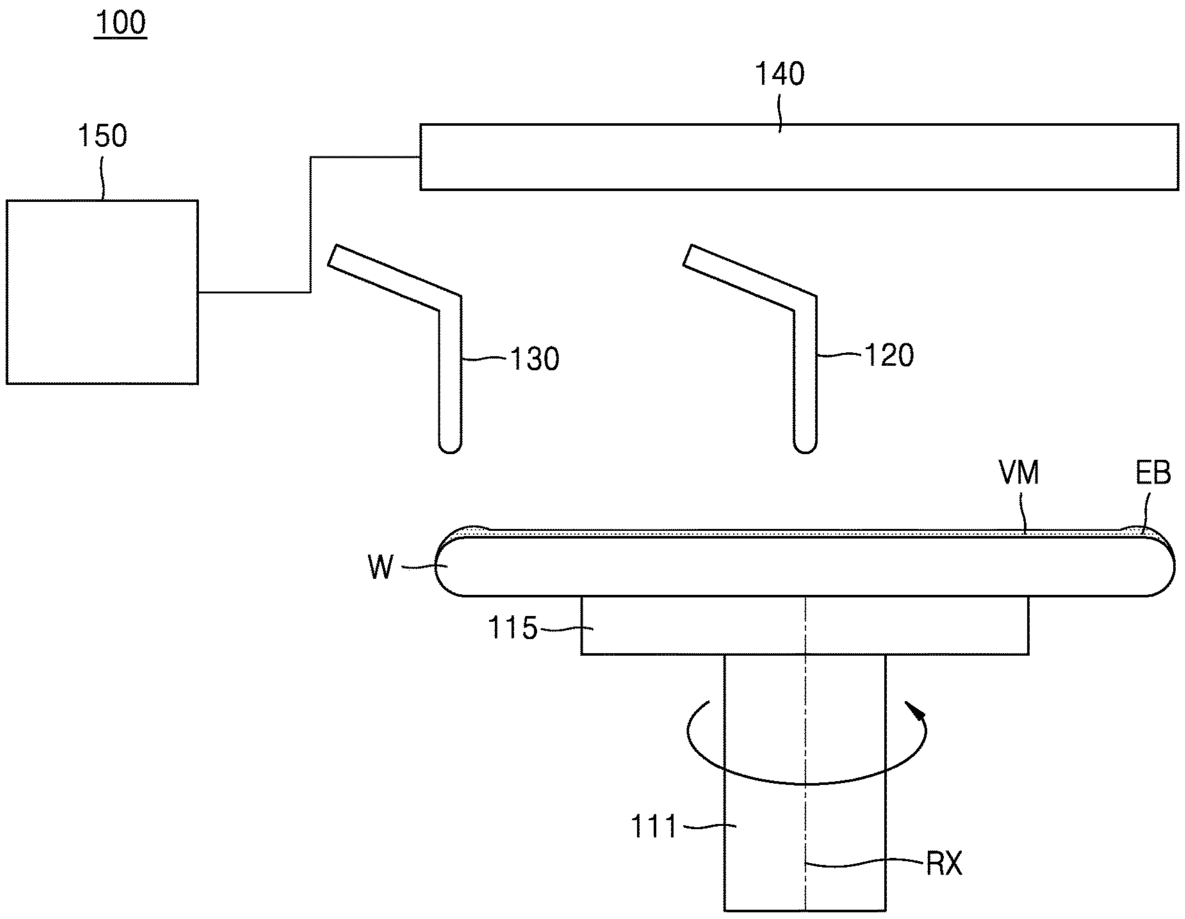

Referring to FIGS. 1, 2A, and 2B, in operation P20, the wafer W may be coated with a viscous material VM.

The rotary driver 111 may rotate the chuck 115 around a rotary axis RX to spin the wafer W. An excess portion of the viscous solution VS may be blown off from the wafer W by the spinning of the wafer W, and accordingly, the viscous material VM may be coated on an upper surface of the wafer W. In an embodiment, coating the wafer may include coating a portion of the upper surface of the wafer W. In an embodiment, the entirety of the upper surface of the wafer W may be coated. After coating the wafer W with the viscous material VM, the rotary driver 111 may further rotate the wafer W for a certain time to vaporize a solvent so that the wafer W is dried.

As described above, the spin coater 100 may be configured to coat the wafer W with the viscous material VM by spin coating.

As shown in, for example, FIG. 2B, the viscous material VM may include an edge bead EB. The edge bead EB may have a bump shape. The edge bead EB may be formed as the viscous material VM is deposited on an edge portion of the wafer W while spinning the wafer W and the edge bead EB may be an undesirable deposit. The edge bead EB may be formed on an edge of the wafer W along at least a portion of a circumference of the wafer W. In an embodiment, the edge bead EB may be further formed on a side surface and a lower surface of the wafer W in addition to the upper surface of the wafer W. The edge bead EB may interrupt alignment of an exposure mask. In addition, the viscous material VM may be dried by a bake process or the like and then partially released from the wafer W, thereby resulting in particle contamination in a subsequent process.

The process described above, for example, providing a solution, such as the viscous solution VS, onto the wafer W in a stop state and then spinning the wafer W to coat the wafer W with a material layer of the viscous material VM or the like, may be referred to as static spin coating. Unlike this, the viscous material VM may be provided by dynamic spin coating. For example, the viscous material VM may be provided onto the wafer W by dynamic spin coating for providing the viscous solution VS onto the wafer W, which is being spun.

Figure 2C:
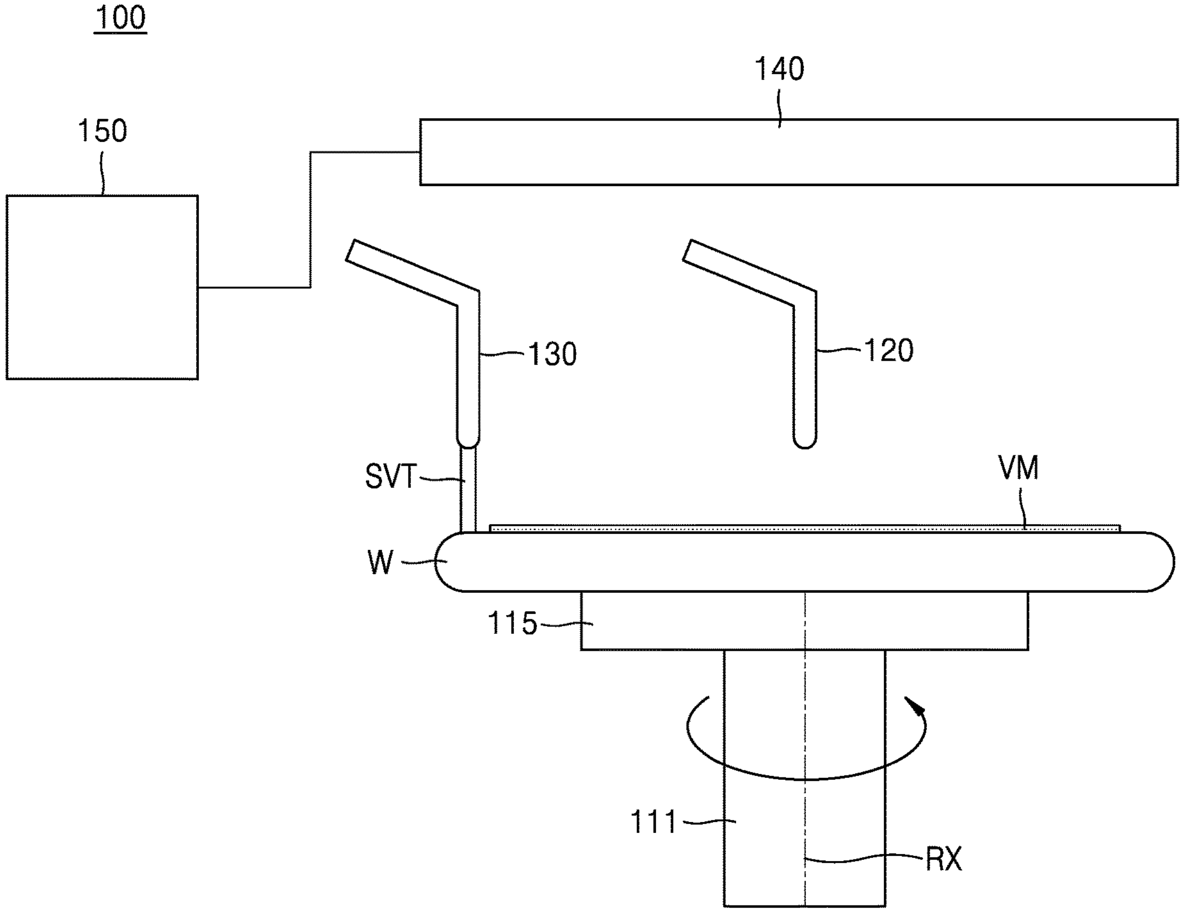

Referring to FIGS. 1, 2B, and 2C, in operation P30, the edge bead EB may be removed.

The second dispenser 130 of the spin coater 100 may provide a solvent SVT to the edge of the wafer W to remove the edge bead EB of the viscous material VM, which is formed on the edge of the wafer W.

According to some embodiments, the spin coater 100 may further include an additional dispenser configured to spray a solvent for removing an edge bead which may be attached to the lower surface of the wafer W. While providing the solvent SVT, the rotary driver 111 may rotate the chuck 115. A radiation-directional width of a portion of the wafer W exposed by removing the edge bead EB by the solvent SVT is referred to as an exclusion width. After the spray of the solvent SVT ends, the rotary driver 111 may further rotate the chuck 115 for a certain time to dry the wafer W.

After removing the edge bead EB, a laser cleaning process for clearly defining a contour of a viscous material VM' and removing undesirable debris may be performed.

In the series of processes described with reference to FIGS. 2A to 2C, a speed at which the rotary driver 111 rotates the chuck 115 may vary. In more detail, the rotary driver 111 may rotate the chuck 115 at different speeds when performing each of a process of coating the viscous material VM, a process of drying the wafer W after forming the viscous material VM, a process of removing the edge bead EB, and a process of drying the wafer W after removing the edge bead EB. For example, in some embodiments, the rotary driver 111 may rotate the chuck 115 at a different speed for each process. In some embodiments the rotary driver 111 may rotate the chuck 115 at different speeds for some processes and the same speed for some processes.

Figure 2D:
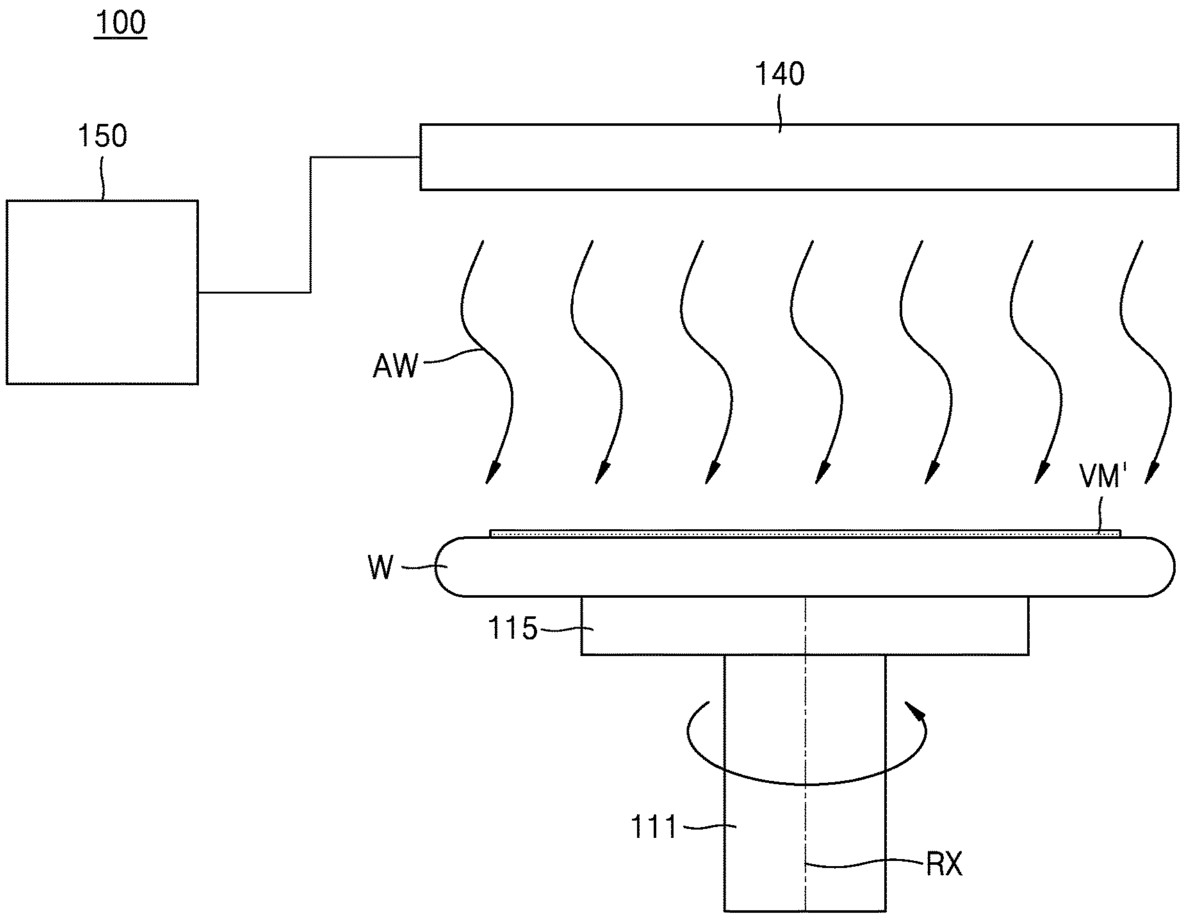

Referring to FIGS. 1 and 2D, in operation P40, the wafer W may be treated by an acoustic wave AW. According to embodiments, the acoustic wave AW may be generated by the acoustic wave generator 140.

While performing the treatment by the acoustic wave AW, each of the first and second dispensers 120 and 130 may move to a home port that is a waiting position. Accordingly, distortion of the acoustic wave AW due to the first and second dispensers 120 and 130 may be prevented, and a uniform treatment of the acoustic wave AW all over the surface of the wafer W may be possible.

According to embodiments, the acoustic wave generator 140 may generate the acoustic wave AW. The acoustic wave generator 140 may orient the generated acoustic wave AW toward the wafer W coated with the viscous material VM'. As a non-limiting example, the acoustic wave generator 140 may include a piezoelectric element.

According to embodiments, the acoustic wave generator 140 may select a frequency of the acoustic wave AW. According to embodiments, the acoustic wave generator 140 may be configured to adjust the frequency of the acoustic wave AW. For example, the frequency of the acoustic wave AW generated by the acoustic wave generator 140 may vary over time. According to embodiments, the frequency of the acoustic wave AW may be in a range of about 20 Hz to about 200 MHz.

The adjustment of the frequency of the acoustic wave AW by the acoustic wave generator 140 may be performed based on a position of a node of vibration of the wafer W caused by the acoustic wave AW. According to embodiments, by the adjustment of the frequency of the acoustic wave AW, a first node formed on the wafer W by coupling of the acoustic wave AW transferred to the wafer W at a first time may differ from a second node formed on the wafer W by coupling of the acoustic wave AW transferred to the wafer W at a second time following the first time. According to embodiments, by adjusting the frequency of the acoustic wave AW by the acoustic wave generator 140, the whole surface of the wafer W may be uniformly treated by the acoustic wave AW.

The acoustic wave generator 140 may be configured to generate acoustic waves AW having two or more different frequencies at the same time.

According to embodiments, the acoustic wave generator 140 may be synchronized with other elements, e.g., the rotary driver 111, of the spin coater 100. The acoustic wave generator 140 may be configured to generate the acoustic wave AW so as to have a proper amplitude and frequency in response to an operation of, for example, the rotary driver 111.

According to embodiments, the frequency of the acoustic wave AW generated by the acoustic wave generator 140 may be substantially the same as an eigenfrequency of the wafer W. Herein, the eigenfrequency of the wafer W may depend on physical parameters of the wafer W, such as a shape (e.g., a diameter and a direction indicator, such as a notch or a D-cut) of the wafer W including the viscous material VM' and a mass of the wafer W including the viscous material VM'.

According to embodiments, the acoustic wave AW having substantially the same frequency as the eigenfrequency of the wafer W may be well coupled to the wafer W, and accordingly, the whole surface (excluding nodes) of the wafer W may uniformly vibrate.

The acoustic wave generator 140 may be configured to adjust an amplitude of the acoustic wave AW.

The controller 150 may be configured to generate a signal for adjusting the acoustic wave AW to be generated by the acoustic wave generator 140. The controller 150 may be configured to generate a signal for adjusting either the amplitude or the frequency of the acoustic wave AW. The controller 150 may be configured to generate a signal for changing the amplitude and frequency of the acoustic wave AW in a set order or generating the acoustic wave AW so as to include two or more frequency components.

The controller 150 may include at least one of a memory and a processor configured to process a command stored in the memory or a control signal from the outside. The controller 150 may be implemented by hardware, firmware, software, or an arbitrary combination thereof. For example, the controller 150 may include a computing device, such as a workstation computer, a desktop computer, a laptop computer, or a tablet computer. The controller 150 may include a simple controller, a complex processor, such as a microprocessor, a central processing unit (CPU), or a graphics processing unit (GPU), a processor configured by software, exclusive hardware, or firmware and one or more of these may be the processor included in the controller. The controller 150 may be implemented by, for example, a general-purpose computer or application-specific hardware, such as a digital signal processor (DSP), a field programmable gate array (FPGA), or an application-specific integrated circuit (ASIC). In the example embodiments, the controller 150 may include a processor, the processor may perform functions or have the structure described with respect to the controller 150. For example, the processor may be implemented by, for example, a general-purpose computer or application-specific hardware, such as a digital signal processor (DSP), a field programmable gate array (FPGA), or an application-specific integrated circuit (ASIC).

According some embodiments, an operation of the controller 150 may be implemented by commands stored in a machine-readable medium readable and executable by one or more processors. Herein, the machine-readable medium may include an arbitrary mechanism configured to store and/or transmit information in a format readable by a machine (e.g., a computing device). For example, the machine-readable medium may include read-only memory (ROM), random access memory (RAM), a magnetic disk storage medium, an optical storage medium, flash memory devices, an electrical, optical, acoustic, or other form of radio signal (e.g., a carrier, an infrared signal, or a digital signal), and other random signals.

To perform the operations described above or below with the controller 150, firmware, software, routines, and instructions may also be configured. In embodiments, the aforementioned and below operations of the memory and the processor may be performed by a computing device, a processor, a controller, or another device configured to execute firmware, software, a routine, an instruction, and the like.

Figure 3A:
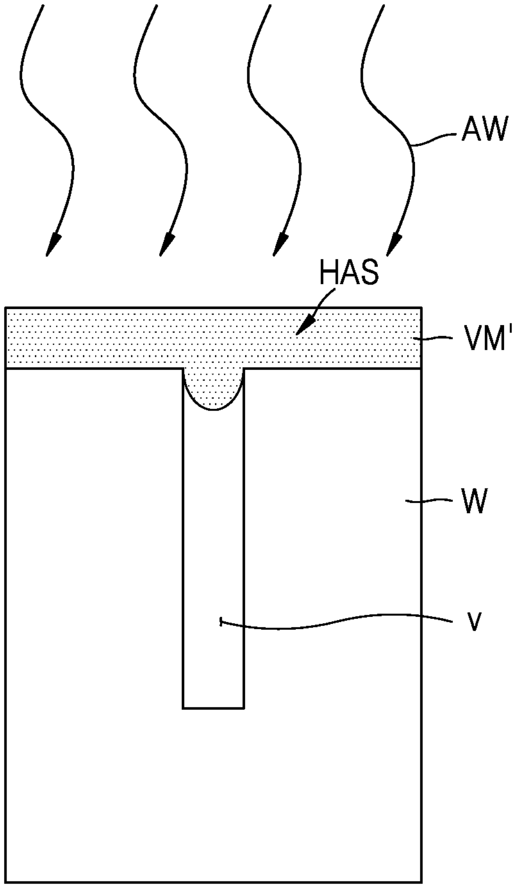
FIGS. 3A and 3B are cross-sectional views for describing a treatment by an acoustic wave.
Figure 3B:
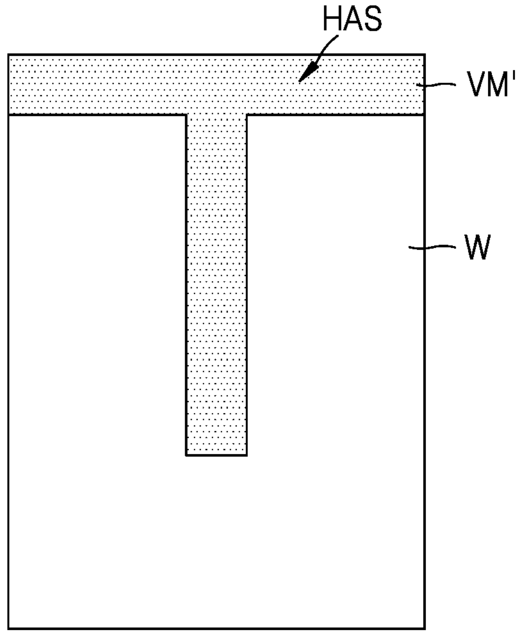

FIGS. 3A and 3B are cross-sectional views for describing a treatment by the acoustic wave AW.

Referring to FIG. 3A, the wafer W may include a high aspect ratio structure HAS. The high aspect ratio structure HAS may be formed by etching any one of a metal material, a dielectric material, and a semiconductor material. When the viscous material VM' is coated on the high aspect ratio structure HAS, the viscous material VM' may not be well introduced into a recessed part of the high aspect ratio structure HAS due to a surface tension of the viscous material VM'.

A process of coating the viscous material VM' on the high aspect ratio structure HAS including the recessed part may include, for example, coating an SOH on the wafer W (see FIG. 1) having a spacer for self-aligned double patterning (SADP), self-aligned quadruple patterning (SAQP), and self-aligned reverse patterning (SARP).

One of the representative examples of a process of coating the viscous material VM' on the high aspect ratio structure HAS including the recessed part may include coating an SOD on to a patterned circuit. In an embodiment, the SOD coating may cover a patterned circuit.

When the viscous material VM' is not well introduced into the recessed part of the high aspect ratio structure HAS, a void v may be formed. The void v may cause bad adhesion of the viscous material VM' to the wafer W, outgassing occurring during a bake process, and particle contamination occurring due to the outgassing.

Referring to FIGS. 3A and 3B, the wafer W coated with the viscous material VM' may be treated using the acoustic wave AW to fill the void v with the viscous material VM'. Accordingly, the void v may be removed, and the reliability of the treatment of the wafer W using the viscous material VM' may be improved.

Figure 4:
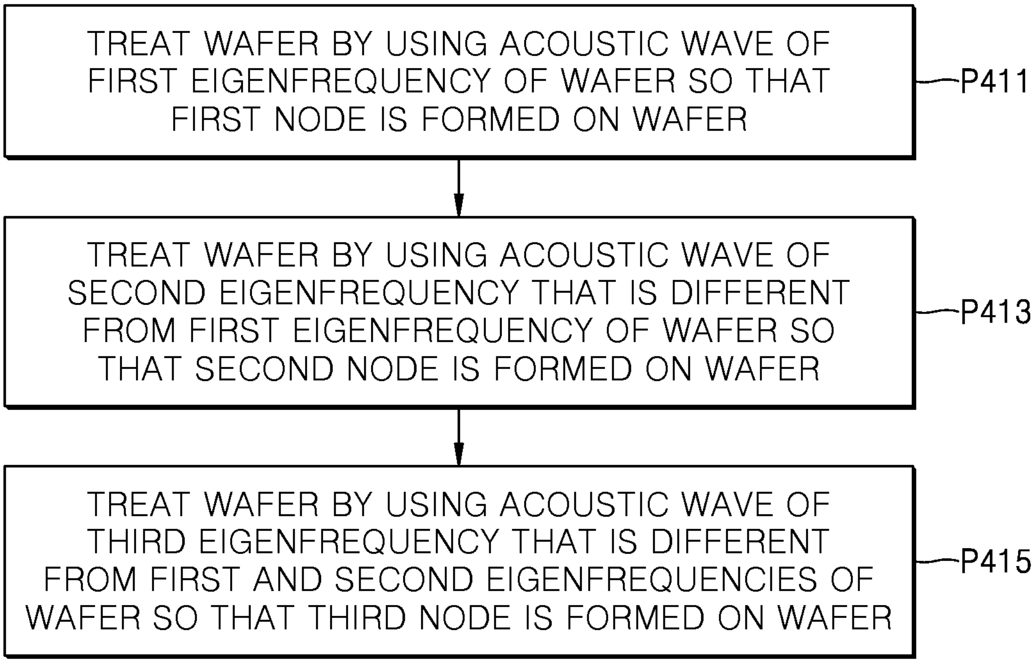
FIG. 4 is a flowchart for describing a treatment of a wafer by an acoustic wave in operation P40 of FIG. 1.

FIG. 4 is a flowchart for describing a treatment of a wafer by an acoustic wave in operation P40 of FIG. 1.

Figure 5A:
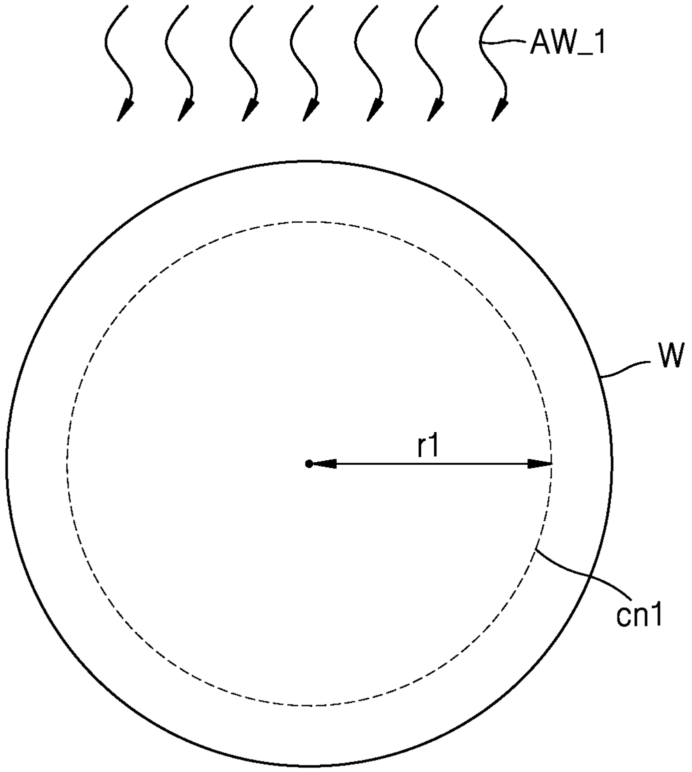
FIGS. 5A to 5C are top views illustrating states of a wafer.
Figure 5B:
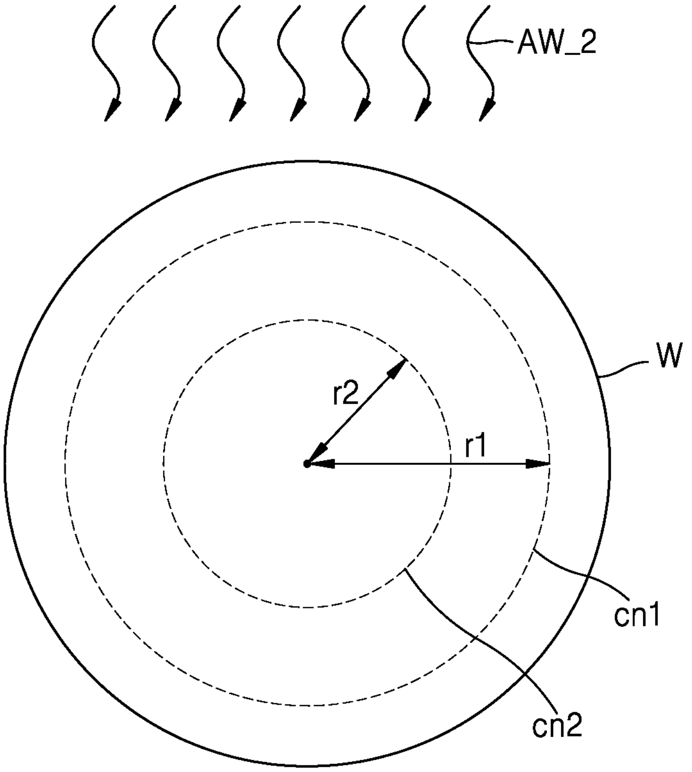
Figure 5C:
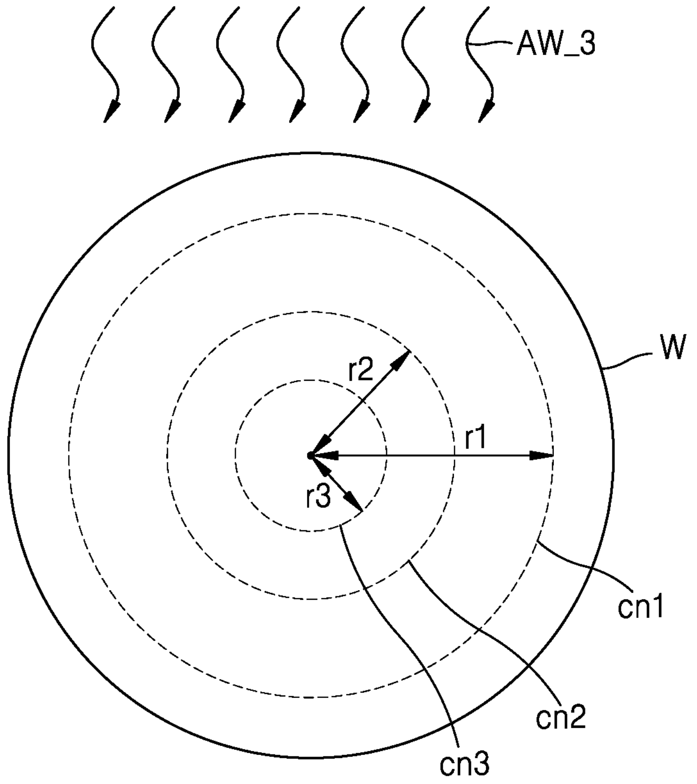

FIGS. 5A to 5C are top views illustrating states of the wafer W by operation P40. In FIGS. 5A to 5C and FIGS. 6A to 7 to be referred to below, the viscous material VM' (see FIG. 2D) is omitted, and only the wafer W and nodes formed on the wafer W are shown.

Referring to FIGS. 4 and 5A, operation P40 may include operation P411 of treating the wafer W by an acoustic wave AW_1 having a first eigenfrequency of the wafer W so that a first node cn1 is formed on the wafer W.

The acoustic wave AW_1 having the first eigenfrequency may be coupled to the wafer W. The wafer W to which the acoustic wave AW_1 is applied may resonate. The first node cn1 may be formed by the resonance of the wafer W. The first node cn1 may have symmetry (e.g., circular symmetry) originated from a physical shape of the wafer W. The first node cn1 may have a circular shape. The first node cn1 may be a set of dots spaced apart by a first radius r1 from the center of the wafer W.

Points of the wafer W on the first node cn1 may have substantially no vibration. An amplitude of vibration at each of points of the wafer W may gradually increase away from the first node cn1. For example, in the example of FIG. 5A, an amplitude of a vibration at the center of the wafer W may be greatest.

The first node cn1 may partition the wafer W to define vibration regions on the wafer W. For example, in FIG. 5A, a vibration region outside the first node cn1 and a vibration region inside the first node cn1 may be defined. This vibration state of the wafer W may be a kind of normal wave. This normal wave is not a normal wave between the acoustic generator 140 (see FIG. 2D), which is a source of the acoustic wave AW_1, and the wafer W, which is a target of irradiation of the acoustic wave AW_1, but a normal wave on the surface of the wafer W by the resonance of the wafer W.

Referring to FIGS. 4 and 5B, operation P40 may include operation P413 of treating the wafer W by an acoustic wave AW_2 having a second eigenfrequency that is different from the first eigenfrequency of the wafer W so that a second node cn2 is formed on the wafer W. According to embodiments, the second eigenfrequency may be higher than the first eigenfrequency.

The acoustic wave AW_2 having the second eigenfrequency may be coupled to the wafer W. The wafer W to which the acoustic wave AW_2 having the second eigenfrequency is applied may resonate. The second node cn2 may be formed by the resonance of the wafer W. The second node cn2 may have symmetry (e.g., circular symmetry) originated from the physical shape of the wafer W. The second node cn2 may have a circular shape. The second node cn2 may be a set of dots spaced apart by a second radius r2 from the center of the wafer W. The acoustic wave AW_2 having the second eigenfrequency may cause the first node cn1 to be formed in addition to the second node cn2.

Points of the wafer W on the first and second nodes cn1 and cn2 may have substantially no vibration. An amplitude of vibration of each of points of the wafer W may gradually increase away from each of the first and second nodes cn1 and cn2.

The first and second nodes cn1 and cn2 may partition the wafer W to define vibration regions on the wafer W. For example, in FIG. 5B, a vibration region outside the first node cn1, a vibration region between the first and second nodes cn1 and cn2, and a vibration region inside the second node cn2 may be defined.

Referring to FIGS. 4 and 5C, operation P40 may include operation P415 of treating the wafer W by an acoustic wave AW_3 having a third eigenfrequency that is different from the first and second eigenfrequencies of the wafer W so that a third node cn3 is formed on the wafer W. According to embodiments, the third eigenfrequency may be higher than the second eigenfrequency.

The acoustic wave AW_3 having the third eigenfrequency may be coupled to the wafer W. The wafer W to which the acoustic wave AW_3 having the third eigenfrequency is applied may resonate. The third node cn3 may be formed by the resonance of the wafer W. The third node cn3 may have symmetry (e.g., circular symmetry) corresponding to the physical shape of the wafer W. For example, in an example embodiment, the wafer W may have a circular shape and the third node cn3 may have circular symmetry. The third node cn3 may have a circular shape. in an embodiment, the third node cn3 may be a set of dots spaced apart by a third radius r3 from the center of the wafer W. The acoustic wave AW_3 having the third eigenfrequency may cause the first and second nodes cn1 and cn2 to be formed in addition to the third node cn3.

Points of the wafer W on the first to third nodes cn1, cn2, and cn3 may have substantially no vibration. An amplitude of vibration of each of points of the wafer W may gradually increase away from each of the first to third nodes cn1, cn2, and cn3.

The first to third nodes cn1, cn2, and cn3 may partition the wafer W to define vibration regions on the wafer W. For example, in FIG. 5C, a vibration region outside the first node cn1, a vibration region between the first and second nodes cn1 and cn2, a vibration region between the second and third nodes cn2 and cn3, and a vibration region inside the third node cn3 may be defined.

Referring to FIGS. 5A to 5C, a wafer resonance state by coupling of the acoustic waves AW_1, AW_2, and AW_3 respectively having the first to third eigenfrequencies is referred to as a mode. The mode may be classified based on a shape of nodes. Besides the circular first to third nodes cn1, cn2, and cn3 as described above, as described below with reference to FIGS. 6A to 6D, there may be a mode of forming nodes on diameters. That is, in some example embodiments there may be circular nodes and in other example embodiments there may be nodes on parts of or full diameters of a wafer, though embodiments are not limited thereto.

Accordingly, to discriminate a mode of forming radial nodes from a mode of forming circular nodes, a mode of the wafer W is represented by two-dimensional coordinates. For example, a resonance state of the wafer W having the first node cn1 formed thereon by the acoustic wave AW_1 having the first eigenfrequency is defined as a (1, 0) mode. In addition, a resonance state of the wafer W having the first and second nodes cn1 and cn2 formed thereon by the acoustic wave AW_2 having the second eigenfrequency is defined as a (2, 0) mode. In addition, a resonance state of the wafer W having the first to third nodes cn1, cn2, and cn3 formed thereon by the acoustic wave AW_3 having the third eigenfrequency is defined as a (3, 0) mode.

Referring back to FIGS. 1 and 2D, treating the wafer W by the acoustic wave AW may include sequentially changing a state of the wafer W to the (1, 0) mode, the (2, 0) mode, and the (3, 0) mode. Accordingly, the whole surface of the wafer W may uniformly vibrate, and the reliability of a process using the viscous material VM' may be improved.

The first to third eigenfrequencies described above may have values discrete from each other. Accordingly, sequentially applying the acoustic wave AW_1 (see FIG. 5A) of the first eigenfrequency, the acoustic wave AW_2 (see FIG. 5B)

of the second eigenfrequency, and the acoustic wave AW_3 (see FIG. 5C) of the third eigenfrequency to the wafer W is discretely changing the frequency of the acoustic wave AW generated by the acoustic wave generator 140 and thus may be referred to as frequency stepping.

FIGS. 6A to 6D are top views illustrating states of the wafer W by operation P40.

Figure 6A:
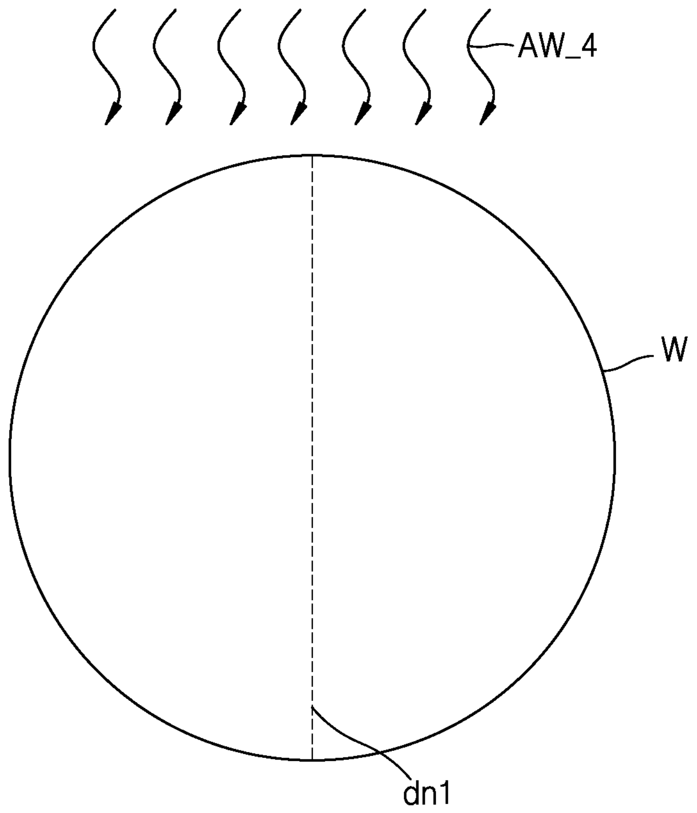
FIGS. 6A to 6D are top views illustrating states of a wafer.

Referring to FIG. 6A, the wafer W may be treated by an acoustic wave AW_4 having a fourth eigenfrequency, which is different from each of the first to third eigenfrequencies.

The acoustic wave AW_4 having the fourth eigenfrequency may be coupled to the wafer W. The wafer W to which the acoustic wave AW_4 having the fourth eigenfrequency is applied may resonate. A first node dn1 may be formed by the resonance of the wafer W. The first node dn1 may have symmetry (e.g., radial symmetry) corresponding to a physical shape of the wafer W. For example, in an example embodiment, the wafer W may have a circular shape and the first node dn1 may have circular symmetry. The first node dn1 may be along part of or a full diameter of the wafer W. For example, the first node dn1 may include points on a straight line crossing the center of the wafer W.

The points of the wafer W on the first node dn1 may have substantially no vibration. An amplitude of vibration of each of points of the wafer W may gradually increase away from the first node dn1. The first node dn1 may partition the wafer W to define vibration regions on the wafer W. Parts of the wafer W partitioned by the first node dn1 may have a central angle of about 180 degrees.

Figure 6B:
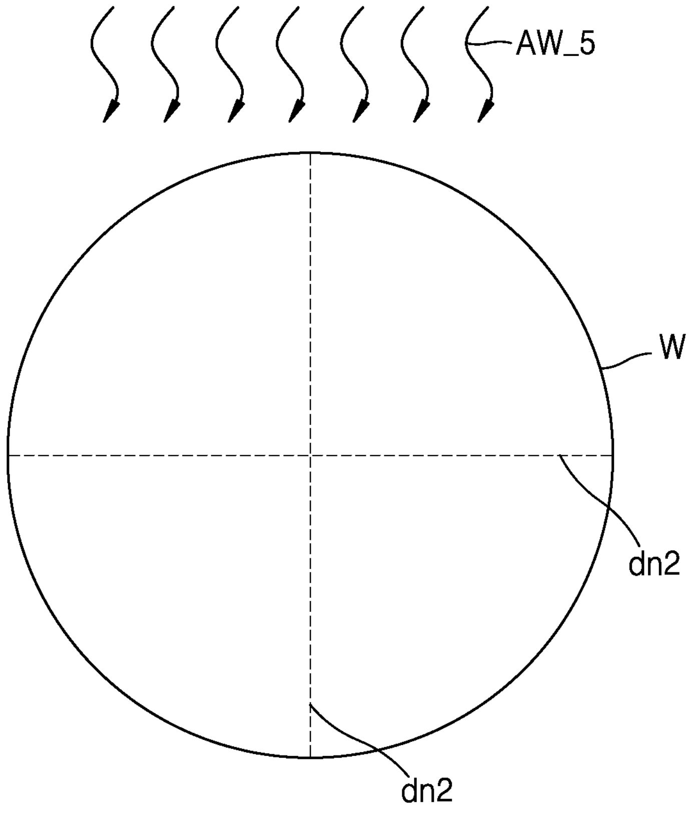

Referring to FIG. 6B, the wafer W may be treated by an acoustic wave AW_5 having a fifth eigenfrequency, which is different from each of the first to fourth eigenfrequencies.

The acoustic wave AW_5 having the fifth eigenfrequency may be coupled to the wafer W. The wafer W to which the acoustic wave AW_5 having the fifth eigenfrequency is applied may resonate. Second nodes dn2 may be formed by the resonance of the wafer W. The second nodes dn2 may have symmetry (e.g., radial symmetry) originated from the physical shape of the wafer W. Each of the second nodes dn2 may be the diameter of the wafer W. The second nodes dn2 may be substantially perpendicular to each other. For example, the second nodes dn2 may include points on two straight lines crossing the center of the wafer W. The two straight lines crossing the center of the wafer W may be partial or full diameters of the wafer.

The points of the wafer W on the second nodes dn2 may have substantially no vibration. An amplitude of vibration of each of points of the wafer W may gradually increase away from each of the second nodes dn2. The second nodes dn2 may partition the wafer W to define vibration regions on the wafer W. Parts of the wafer W partitioned by the second nodes dn2 may have a central angle of about 90 degrees.

Figure 6C:
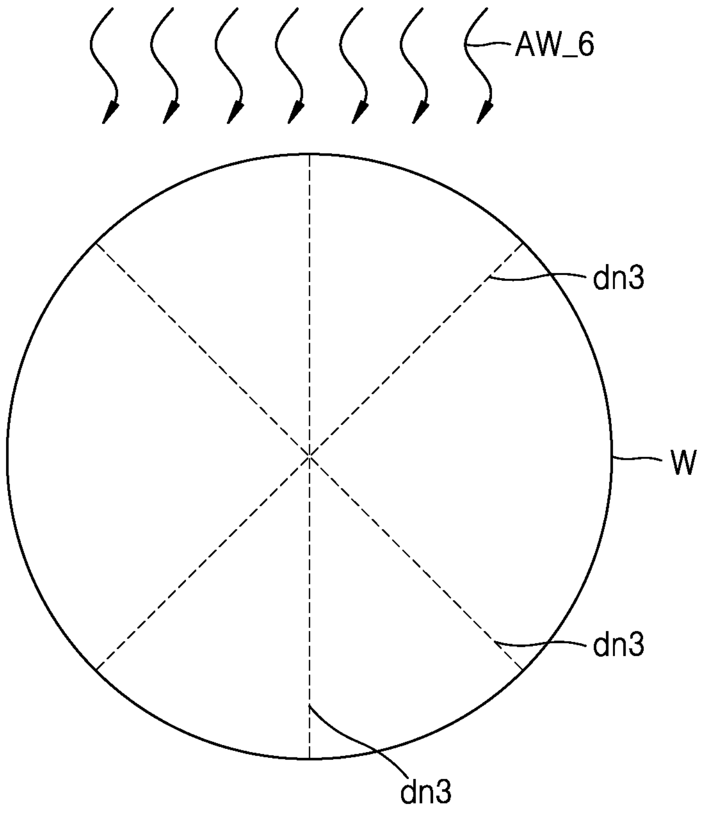

Referring to FIG. 6C, the wafer W may be treated by an acoustic wave AW_6 having a sixth eigenfrequency, which is different from each of the first to fifth eigenfrequencies.

The acoustic wave AW_6 having the sixth eigenfrequency may be coupled to the wafer W. The wafer W to which the acoustic wave AW_6 having the sixth eigenfrequency is applied may resonate. Third nodes dn3 may be formed by the resonance of the wafer W. The third nodes dn3 may have symmetry (e.g., radial symmetry) originated from the physical shape of the wafer W. Each of the third nodes dn3 may be the diameter of the wafer W. An angle between the third nodes dn3 may be about 60 degrees. For example, the third nodes dn3 may include points on three straight lines crossing the center of the wafer W.

The points of the wafer W on the third nodes dn3 may have substantially no vibration. An amplitude of vibration of each of points of the wafer W may gradually increase away from each of the third nodes dn3. The third nodes dn3 may partition the wafer W to define vibration regions on the wafer W. Parts of the wafer W partitioned by the third nodes dn3 may have a central angle of about 60 degrees.

Figure 6D:
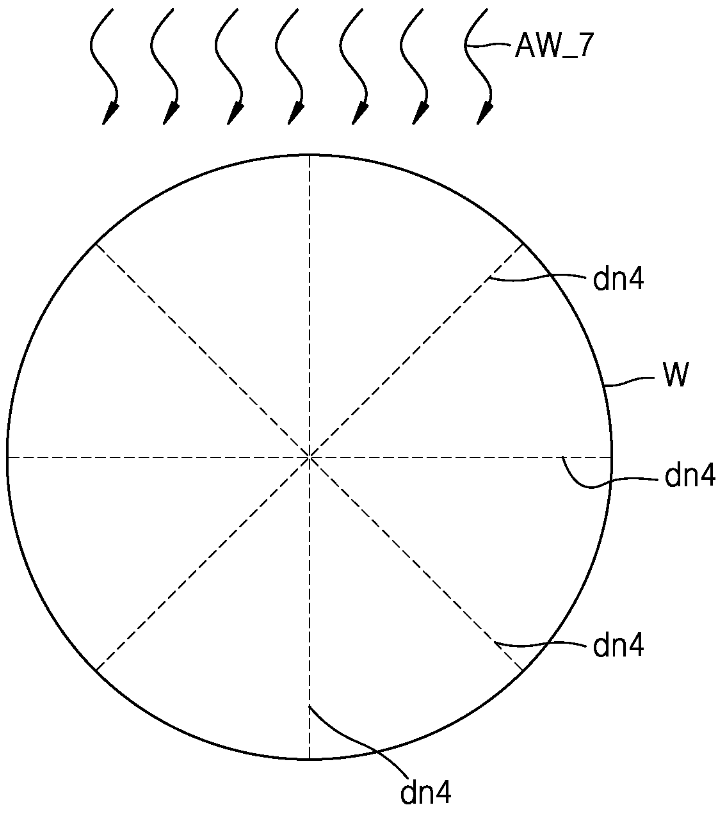

Referring to FIG. 6D, the wafer W may be treated by an acoustic wave AW_7 having a seventh eigenfrequency, which is different from each of the first to sixth eigenfrequencies.

The acoustic wave AW_7 having the seventh eigenfrequency may be coupled to the wafer W. The wafer W to which the acoustic wave AW_7 having the seventh eigenfrequency is applied may resonate. Fourth nodes dn4 may be formed by the resonance of the wafer W. The fourth nodes dn4 may have symmetry (e.g., radial symmetry) originated from the physical shape of the wafer W. Each of the fourth nodes dn4 may be the diameter of the wafer W. An angle between the fourth nodes dn4 may be about 45 degrees.

Points of the wafer W on the fourth nodes dn4 may have substantially no vibration. An amplitude of vibration of each of points of the wafer W may gradually increase away from each of the fourth nodes dn4. The fourth nodes dn4 may partition the wafer W to define vibration regions on the wafer W. Parts of the wafer W partitioned by the fourth nodes dn4 may have a central angle of about 45 degrees.

Referring to FIGS. 6A to 6D, a state of a node may be represented by coordinates similarly to the description made above with reference to FIGS. 5A to 5C. For example, a resonance state of the wafer W having the first node dn1 formed thereon by the acoustic wave AW_4 having the fourth eigenfrequency is defined as a (0, 1) mode. In addition, a resonance state of the wafer W having the second nodes dn2 formed thereon by the acoustic wave AW_5 having the fifth eigenfrequency is defined as a (0, 2) mode. In addition, a resonance state of the wafer W having the third nodes dn3 formed thereon by the acoustic wave AW_6 having the sixth eigenfrequency is defined as a (0, 3) mode. In addition, a resonance state of the wafer W having the fourth nodes dn4 formed thereon by the acoustic wave AW_7 having the seventh eigenfrequency is defined as a (0, 4) mode.

Figure 7:
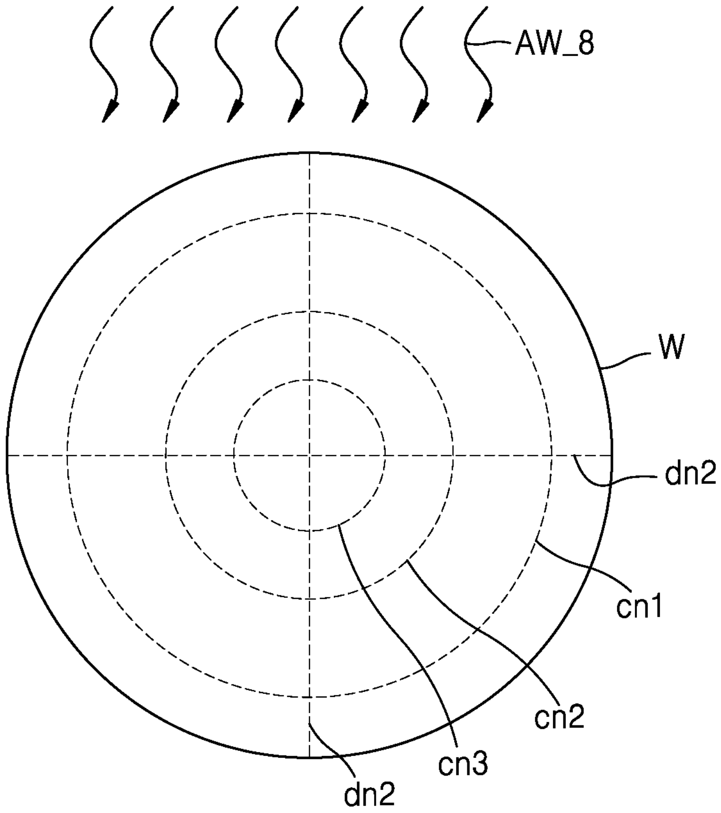
FIG. 7 is a top view for describing a state of a wafer.

FIG. 7 is a top view for describing a state of the wafer W by operation P40.

Referring to FIG. 7, the wafer W may be treated by an acoustic wave AW_8 having an eighth eigenfrequency, which is different from each of the first to seventh eigenfrequencies.

The acoustic wave AW_8 having the eighth eigenfrequency may be coupled to the wafer W. The wafer W to which the acoustic wave AW_8 having the eighth eigenfrequency is applied may resonate. The first to third nodes cn1, cn2, and cn3 and the second nodes dn2 may be formed by the resonance of the wafer W. The first to third nodes cn1, cn2, and cn3 and the second nodes dn2 may have symmetry (e.g., circular symmetry or radial symmetry) originated from the physical shape of the wafer W.

Points of the wafer W on the first to third nodes cn1, cn2, and cn3 and the second nodes dn2 may have substantially no vibration. An amplitude of vibration of each of points of the wafer W may gradually increase away from each of the first to third nodes cn1, cn2, and cn3 and the second nodes dn2. The first to third nodes cn1, cn2, and cn3 and the second nodes dn2 may partition the wafer W to define vibration regions on the wafer W.

In the present example embodiment, the first to third nodes cn1, cn2, and cn3 and the second nodes dn2 may be formed on the wafer W by applying both the acoustic wave AW_3 having the third eigenfrequency (see FIG. 5C) and the acoustic wave AW_5 having the fifth eigenfrequency (see FIG. 6B) to the wafer W.

According to embodiments, a resonance state in which the first to third nodes cn1, cn2, and cn3 and the second nodes dn2 are formed may be defined as a (3, 2) mode.

Although frequency stepping of sequentially switching the wafer W to the (1, 0) mode, the (2, 0) mode, and the (3, 0) mode has been described with reference to FIGS. 4 to 5C, those of ordinary skill in the art could easily understand frequency stepping between randomly different modes resulting in different nodes on the wafer W, based on the description made herein.

Figure 8:
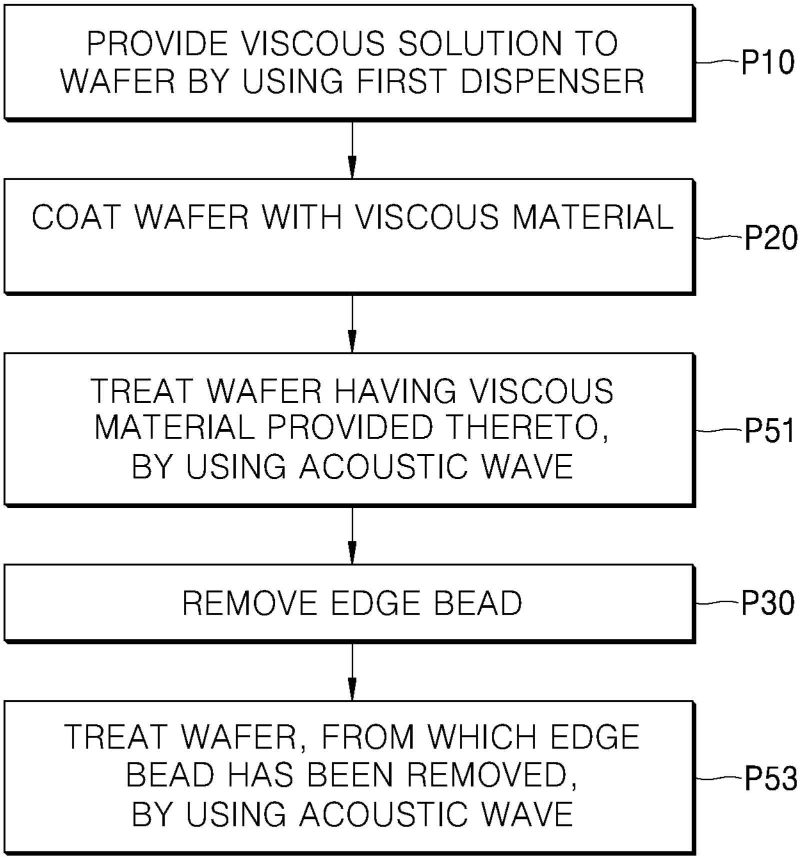
FIG. 8 is a flowchart for describing a method of manufacturing a semiconductor device, according to other embodiments.

FIG. 8 is a flowchart for describing a method of manufacturing a semiconductor device, according to an embodiment.

Figure 9A:
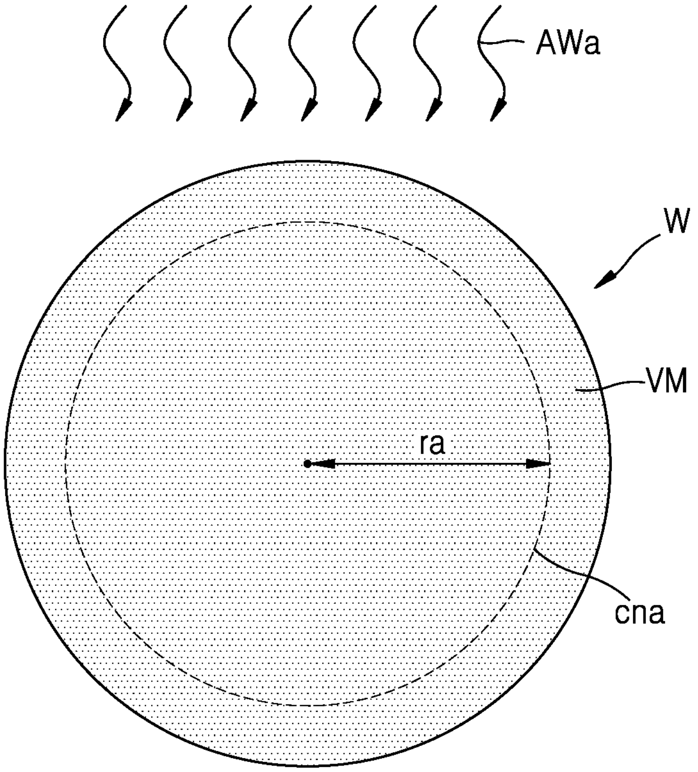
FIGS. 9A and 9B are top views illustrating states of a wafer.
Figure 9B:
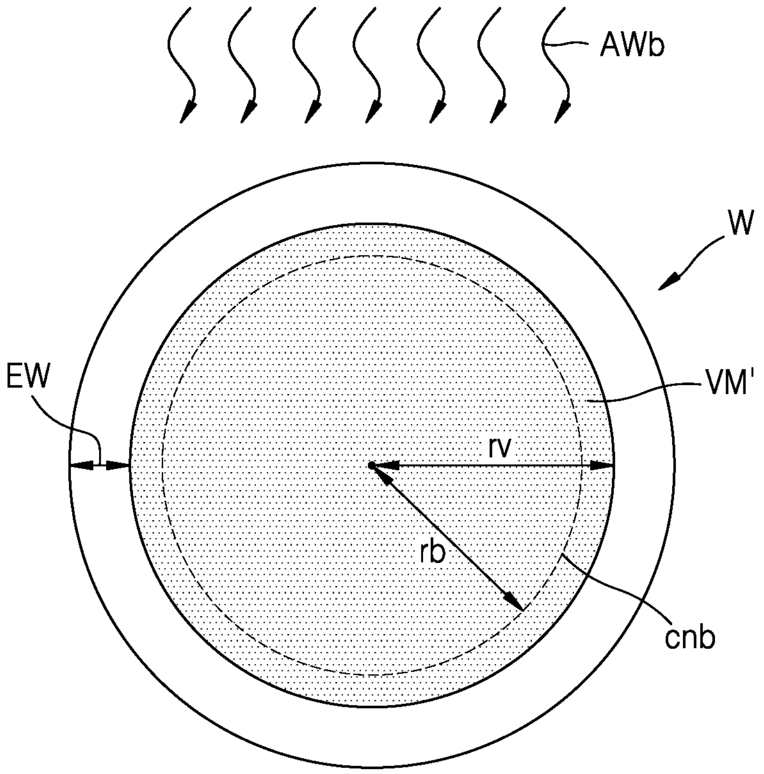

FIGS. 9A and 9B are top views illustrating states of the wafer W. FIGS. 9A and 9B show both the wafer W and the viscous material VM provided onto the wafer W.

Referring to FIG. 8, operations P10 and P20 are substantially the same as described with reference to FIGS. 1 to 2B, and thus, a repetitive description thereof is omitted herein.

Referring to FIGS. 8 and 9A, in operation P51, the wafer W to which the viscous material VM is provided may be treated by an acoustic wave AWa. A frequency of the acoustic wave AWa may be substantially the same as an eigenfrequency of a structure including the wafer W and the viscous material VM.

The acoustic wave AWa may form a first node cna on the wafer W. Points of the wafer W on the first node cna may not substantially vibrate. An amplitude of each of points on the wafer W may gradually increase away from the first node cna. The first node cna may be a set of dots spaced apart by a first radius ra from the center of the wafer W.

Referring to FIGS. 8 and 9B, in operation P30, the edge bead EB (see FIG. 2B) may be removed. Accordingly, a part of the wafer W, which corresponds to an exclusion width EW, may be exposed. The removal of the edge bead EB (see FIG. 2B) is substantially the same as the description made with reference to FIGS. 1, 2B, and 2C.

Thereafter, in operation P53, the wafer W from which the edge bead EB has been removed may be treated by an acoustic wave AWb. A frequency of the acoustic wave AWb may be substantially the same as an eigenfrequency of a structure including the wafer W and the viscous material VM'.

The acoustic wave AWb may form a second node cnb on the wafer W. Points of the wafer W on the second node cnb may have substantially no vibration. An amplitude of each of points on the wafer W may gradually increase away from the second node cnb. The second node cnb may be a set of dots spaced apart by a second radius rb from the center of the wafer W.

Referring to FIGS. 9A and 9B, the first radius ra may differ from the second radius rb. Although FIGS. 9A and 9B show, as a non-limiting example embodiment, that the first radius ra is greater than the second radius rb, the second radius rb may be greater than the first radius ra. According to embodiments, the first node cna may differ from the second node cnb, and overlapping of vibration regions defined by the first node cna and the second node cnb may be disposed on a surface of the wafer W. In an embodiment, the first node cna and the second node cnb may cover a surface of the wafer W. In an embodiment, the first node cna and the second node cnb may cover the whole surface of the wafer W. Furthermore, if the first radius ra is greater than a radius of the viscous material VM' determined by the exclusion width EW, the acoustic wave AWa may be applied onto the whole surface of the viscous material VM' formed on the wafer W, and thus, the reliability of a treatment of the wafer W may be improved.

According to embodiments, the (1, 0) mode including the first and second nodes cna and cnb of different eigenfrequencies and radii may be implemented on the wafer W based on a physical change of the wafer W responding to the removal of the edge bead EB (see FIG. 2B). Accordingly, vibrations covering the whole surface of the wafer W may be implemented by performing frequency stepping only once.

Figure 10:
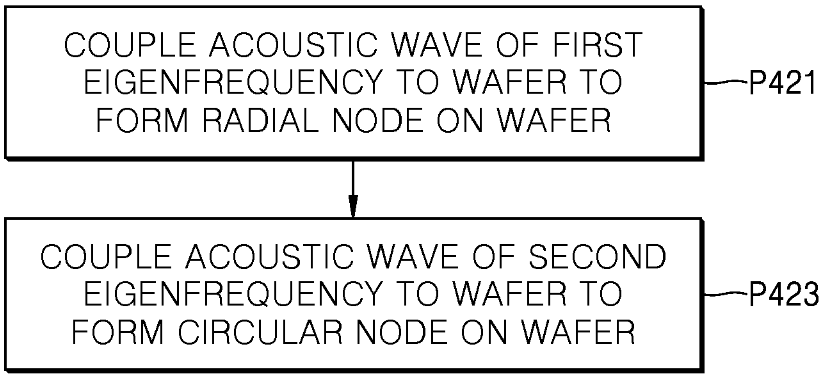
FIG. 10 is a flowchart for describing a treatment of a wafer by an acoustic wave, according to other embodiments.

FIG. 10 is a flowchart for describing a treatment of a wafer by an acoustic wave, according to an embodiment.

Referring to FIGS. 2B and 10, a treatment of the wafer W may include coupling the acoustic wave AW to the wafer W to form a radial node on the wafer W in operation P421.

The treatment of the wafer W may include coupling the acoustic wave AW to the wafer W to form a circular node on the wafer W in operation P423.

In operations P421 and P423, the acoustic wave AW may have different frequencies, respectively. According to embodiments, the wafer W may be in a mode of forming the radial node in operation P421 and a mode of forming the circular node in operation P423. Accordingly, by performing frequency stepping only once, vibration may be applied to most regions of the wafer W by excluding a part where the circular node and the radial node overlap.

Figure 11:
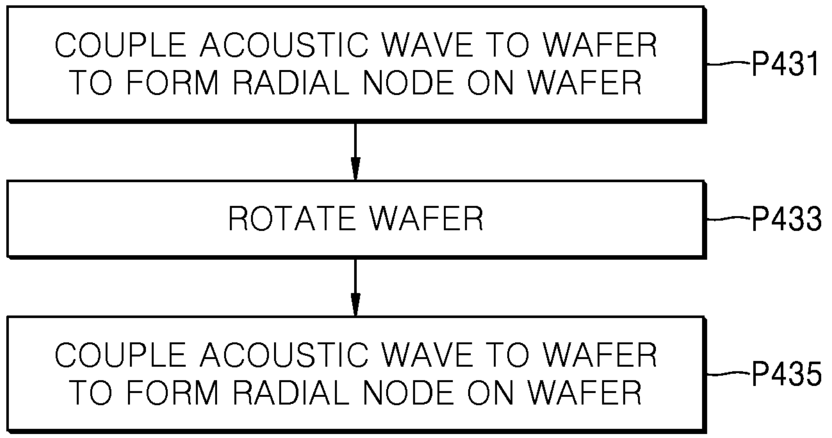
FIG. 11 is a flowchart for describing a treatment of a wafer by an acoustic wave, according to other embodiments.

FIG. 11 is a flowchart for describing a treatment of a wafer by an acoustic wave, according to an embodiment.

Referring to FIGS. 2D and 11, treating the wafer W by the acoustic wave AW may include coupling the acoustic wave AW to the wafer W to form a radial node on the wafer W in operation P431, rotating the wafer Win operation P433, and coupling the acoustic wave AW to the wafer W to form a radial node on the wafer W in operation P435.

According to embodiments, in operations P431 and P435, frequencies of the acoustic wave AW may be substantially the same as each other. According to embodiments, by the rotation of the wafer Win operation P433, a position of the radial node on the wafer W, which is formed in operation P431, may differ from a position of the radial node on the wafer W, which is formed in operation P435. For example, if a rotating angle of the wafer W is 90 degrees in operation P433, the radial node formed in operation P431 may be substantially perpendicular to the radial node formed in operation P435.

According to embodiments, the whole surface of the wafer W excluding a center part of the wafer W may uniformly vibrate by repetitively applying the acoustic wave AW to form a radial node on the wafer W and rotating the wafer W between the applications.

Figure 12:
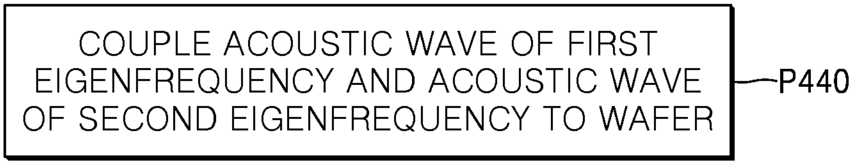
FIG. 12 is a flowchart for describing a treatment of a wafer by an acoustic wave, according to other embodiments.

FIG. 12 is a flowchart for describing a treatment of a wafer by an acoustic wave, according to an embodiment.

Referring to FIGS. 5A, 5B, and 12, a treatment of the wafer W may include coupling the acoustic wave AW_1 of the first eigenfrequency and the acoustic wave AW_2 of the second eigenfrequency to the wafer W in operation P440. According to embodiments, the acoustic wave AW_1 of the first eigenfrequency and the acoustic wave AW_2 of the second eigenfrequency may be simultaneously applied to the wafer W.

According to embodiments, the wafer W may be in a state in which the vibration of FIG. 5A and the vibration of FIG.

5B overlap. When the acoustic wave AW_1 of the first eigenfrequency and the acoustic wave AW_2 of the second eigenfrequency are simultaneously applied to the wafer W, the first node cn1 that is a common node may be maintained, and the second node cn2 may not be maintained. In addition, an amplitude all over the whole surface of the wafer W may be relatively small near the second node cn2.

According to embodiments, a change in the amplitude according to a position may be implemented on the surface of the wafer W by temporally and spatially overlapping the acoustic waves AW_1 and AW_2 of different frequencies on the wafer W. Accordingly, vibration of a relatively large amplitude may be applied to a part vulnerable to a step coverage of the viscous material VM' (see FIG. 2D), and the reliability of coating of the viscous material VM' (see FIG. 2D) may be improved. According to embodiments, simultaneously applying the acoustic waves AW_1 and AW_2 onto the wafer W for a change in the amplitude according to a position on the surface of the wafer W may further include adjusting a phase of any one of the acoustic wave AW_1 of the first eigenfrequency and the acoustic wave AW_2 of the second eigenfrequency.

Figure 13:
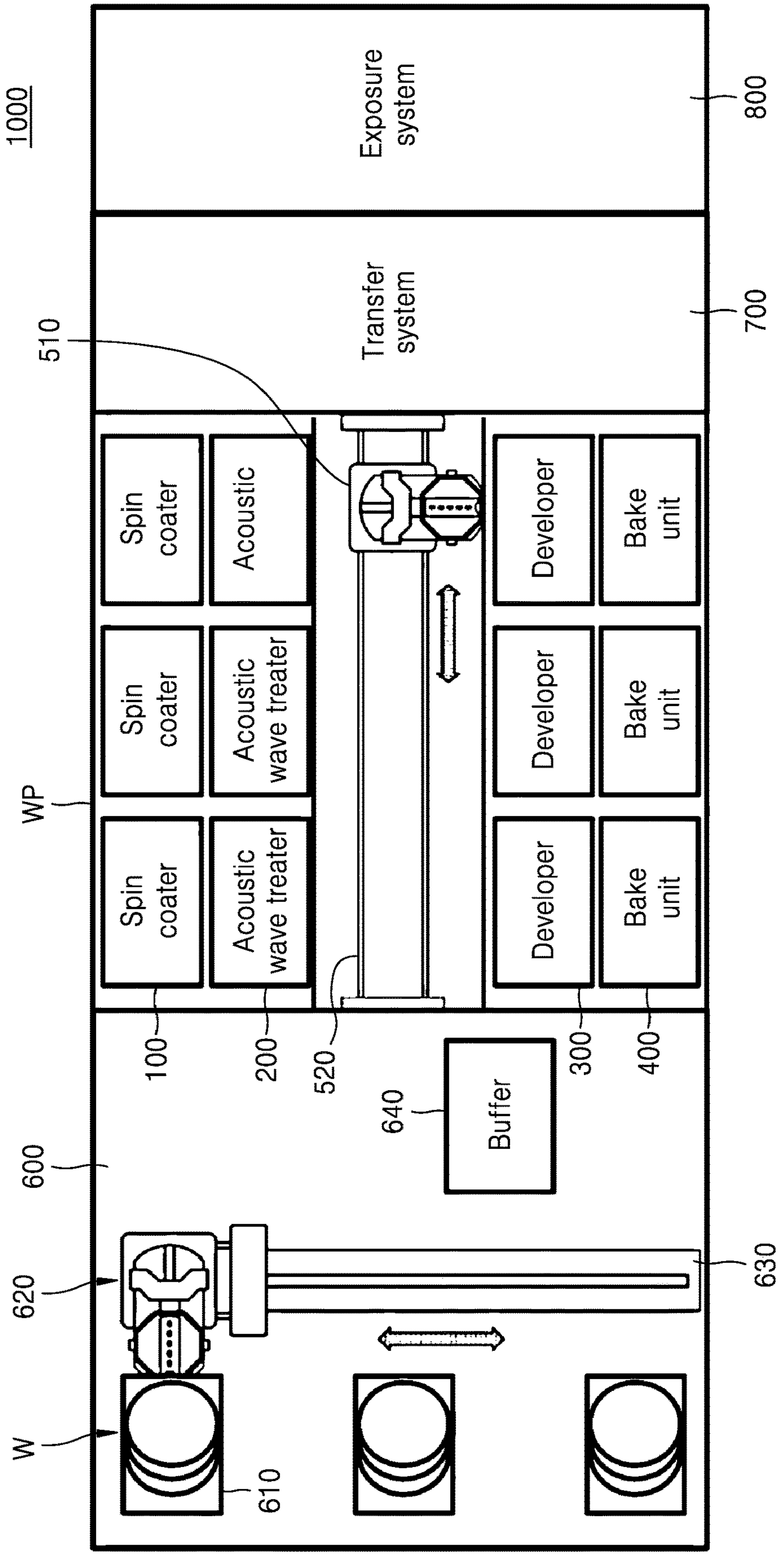
FIG. 13 is a block diagram for describing a lithography system according to some embodiments.

FIG. 13 is a block diagram for describing a lithography system 1000 according to an embodiment.

Referring to FIG. 13, the lithography system 1000 may include a wafer loader 600, a wafer treatment apparatus WP, a transfer system 700, and an exposure system 800. Although not shown in FIG. 13, the lithography system 1000 may further include a monitoring control system configured to control each of components included in the lithography system 1000 and the whole process and monitor a result of the process. The lithography system 1000 may coat the viscous material VM' (see FIG. 2D) on wafers W and perform a process (e.g., a lithography process or an etching process) based on the viscous material VM' (see FIG. 2D).

The wafer loader 600 may include a plurality of load ports 610, an index robot 620, a transfer rail 630, and a buffer 640. The plurality of load ports 610 may accommodate wafers W therein. The index robot 620 may move along the transfer rail 630. The index robot 620 may transfer the wafers W accommodated in the plurality of load ports 610 to the buffer 640.

The wafer treatment apparatus WP may include a plurality of devices configured to perform a series of processes on wafers W. The wafer treatment apparatus WP may include a plurality of spin coaters 100, a plurality of acoustic wave treaters 200, a plurality of developers 300, a plurality of bake units 400, a transfer robot 510, and a transfer rail 520.

For convenience of drawing, although FIG. 13 shows that a plurality of components included in the wafer treatment apparatus WP are horizontally spaced apart from each other, the same components may form a stacked structure (e.g., the plurality of bake units 400 are stacked on one another), or different components may form a stacked structure (e.g., the plurality of acoustic wave treaters 200 are stacked on the plurality of spin coaters 100).

The transfer robot 510 may move along the transfer rail 520 and transfer wafers W from the buffer 640 to at least any one of the plurality of spin coaters 100, the plurality of acoustic wave treaters 200, the plurality of developers 300, and the plurality of bake units 400. The transfer robot 510 may transfer wafers W among the plurality of spin coaters 100, the plurality of acoustic wave treaters 200, the plurality of developers 300, and the plurality of bake units 400. The transfer robot 510 may transfer, to the transfer system 700, wafers W on which a series of processes for exposure have been performed.

The plurality of spin coaters 100 may be substantially the same as described with reference to FIGS. 2A to 2D. The plurality of spin coaters 100 may coat the viscous material VM (see FIG. 2B) and remove the edge bead EB (see FIG. 2B). The plurality of spin coaters 100 may further coat a photoresist on the viscous material VM' (see FIG. 2D). However, embodiments are not limited thereto, and a spin coating process and an edge bead removal (EBR) process may be respectively performed by different devices. Alternatively, the acoustic wave generator 140 and the controller 150 may be omitted from the plurality of spin coaters 100, and wafers W may be treated by the plurality of acoustic wave treaters 200 described below.

The plurality of acoustic wave treaters 200 may treat the viscous material VM' (see FIG. 2D) formed on the wafers W, by using an acoustic wave. An acoustic wave treatment by the plurality of acoustic wave treaters 200 may be performed by the methods described with reference to FIG. 3A to 12. The plurality of acoustic wave treaters 200 are generally similar to the spin coater 100 of FIG. 2A but may not include the first and second dispensers 120 and 130.

The wafer treatment apparatus WP may further include an inspection device configured to inspect a contour of the viscous material VM' (see FIG. 2C) on the wafer W after removing the edge bead EB (see FIG. 2B). The wafer treatment apparatus WP may further include a plurality of edge cleaning units configured to perform laser cleaning on the viscous material VM' (see FIG. 2C) based on an inspection result of the contour.

The plurality of developers 300 may perform a development process on a substrate on which an exposure process has been finished. The development process is to remove an exposed part or a non-exposed part of a photoresist on a viscous material (e.g., a hardmask). The development process may include spraying a developing solution on the wafer W and then spinning the wafer W to uniformly coat the developing solution on the whole surface of the wafer W, or dipping the wafer W in the developing solution for a certain time. The exposed part (or the non-exposed part) of the photoresist may be removed by the development process. To remove contamination particles after the development process, a cleaning process using deionized water or the like may be further performed.

The plurality of bake units 400 may perform a bake process of annealing a substrate. Each of the plurality of bake units 400 may include a bake plate and a chill plate. The bake plate may heat wafers W at a particular temperature for a particular time, and the chill plate may cool down the wafers W heated on the bake plate to a proper temperature.

The plurality of bake units 400 may perform one of more of a soft bake, a post exposure bake (PEB), and hard bake. The soft bake may also be referred to as pre-bake and may be a process of removing an organic solvent remaining on a photoresist and reinforcing adhesion between the photoresist and a wafer. A soft bake process may be performed at a relatively low temperature.

The PEB is a process of flattening unevenness formed on the surface of a photoresist layer according to non-uniformity of the intensity of light by a normal wave formed during exposure. The PEB may activate a photoactive compound (PAC) included in the photoresist layer, and accordingly, unevenness formed on the photoresist layer may be reduced.

The hard bake may be a process of hardening a photoresist after exposure and development processes to improve durability against etching and increasing an adhesive force of the photoresist to the wafer W (or an underlayer). A hard bake process may be performed at a relatively higher temperature than the soft bake process.

The transfer system 700 may include a buffer in which wafers W before and after exposure by the exposure system 800 are stored. The transfer system 700 may transfer, to the exposure system 800, wafers W on which a series of processes (e.g., spin coating, EBR, and soft bake) for exposure have been performed, and transfer exposure-completed wafers W to the wafer treatment apparatus WP.

The exposure system 800 may perform an exposure process on the wafer W. The exposure system 800 may perform extreme ultraviolet (EUV) exposure or deep ultraviolet (DUV) exposure. The exposure system 800 may include a control unit, a measurement station, and an exposure station.

The control unit may include a signal and data processing capacity for performing a desired calculation related to an operation of the exposure system 800. The measurement station may perform measurements on wafers W before performing exposure. The measurement station may map surface heights of the wafers W and measure positions of alignment marks on the wafers W. The alignment mark may have, for example, a box-in-box structure or a diffraction grating structure.

The exposure station may include a projection system. The projection system may perform conditioning and focusing of light for exposure. The projection system may be a random type including a refractive type, a reflective type, a catadioptric type, a magnetic type, an electromagnetic type, an electrostatic optical type, or a combination thereof.

A table on which an exposure mask, such as an EUV/DUV mask, is mounted may be in the exposure station. An EUV/DUV beam may be focused on the exposure mask by the projection system. The exposure mask may be any one of a transmissive-type mask and a reflective-type mask, and patterning light on the exposure mask may reach the wafer W having a coating layer (e.g., a photoresist layer) provided thereto. Accordingly, a pattern formed on the exposure mask may be transferred to the photoresist layer formed on the wafer W.

Wafers W unloaded from the exposure system 800 may be reloaded for additional exposure in the exposure system 800 or patterned by the plurality of developers 300 and the like.

While has aspects of example embodiments have been particularly shown and described, it will be understood that various changes in form and details may be made therein without departing from the spirit and scope of the following claims.

What is claimed is:

1. A method of manufacturing a semiconductor device, the method comprising:

providing a viscous solution to a wafer;

spinning the wafer to coat at least a portion of the wafer with the viscous solution; and treating the wafer coated with the viscous solution, by using an acoustic wave, wherein a frequency of the acoustic wave and an eigenfrequency of the wafer coated with the viscous solution, are same, and wherein the treating the wafer coated with the viscous solution by using the acoustic wave comprises removing a void formed between the viscous solution and a trench formed in the wafer.

2. The method of claim 1, wherein the treating the wafer coated with the viscous solution, by using the acoustic wave, comprises:

treating the wafer by using a first acoustic wave of a first eigenfrequency to form a first node on the wafer; and treating the wafer by using a second acoustic wave of a second eigenfrequency to form a second node, different from the first node, on the wafer.

3. The method of claim 2, wherein each of the first node and the second node has circular symmetry.

4. The method of claim 2, wherein each of the first node and the second node has radial symmetry.

5. The method of claim 2, wherein the first node has circular symmetry, and the second node has radial symmetry.

6. The method of claim 2, wherein the second acoustic wave of the second eigenfrequency further forms the first node on the wafer.

7. The method of claim 6, wherein the first node has circular symmetry, and the second node has radial symmetry.

8. The method of claim 6, wherein the first node has circular symmetry, and the second node has circular symmetry.

* * * * *